(12) United States Patent
Kawabata

(10) Patent No.: US 10,373,917 B2
(45) Date of Patent: Aug. 6, 2019

(54) ELECTRONIC CIRCUIT PACKAGE USING CONDUCTIVE SEALING MATERIAL

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/832,769

(22) Filed: Dec. 5, 2017

(65) Prior Publication Data

US 2019/0172791 A1    Jun. 6, 2019

(51) Int. Cl.
| | |
|---|---|
| *H01L 23/552* | (2006.01) |
| *H01L 21/48* | (2006.01) |
| *H01L 21/56* | (2006.01) |
| *H01L 23/29* | (2006.01) |
| *H01L 23/498* | (2006.01) |
| *H01L 23/00* | (2006.01) |
| *H01L 23/31* | (2006.01) |

(52) U.S. Cl.
CPC .......... *H01L 23/552* (2013.01); *H01L 21/485* (2013.01); *H01L 21/4853* (2013.01); *H01L 21/565* (2013.01); *H01L 23/295* (2013.01); *H01L 23/3128* (2013.01); *H01L 23/49838* (2013.01); *H01L 24/16* (2013.01); *H01L 2224/97* (2013.01); *H01L 2924/15313* (2013.01); *H01L 2924/19042* (2013.01); *H01L 2924/3025* (2013.01)

(58) Field of Classification Search
CPC . H01L 23/552; H01L 21/485; H01L 21/4853; H01L 21/565; H01L 23/295; H01L 23/3128; H01L 23/49838; H01L 24/16; H01L 2224/97; H01L 2924/15313; H01L 2924/19042; H01L 2924/3025
See application file for complete search history.

(56) References Cited

U.S. PATENT DOCUMENTS

| | | | | |
|---|---|---|---|---|
| 7,488,903 B2* | 2/2009 | Kawagishi | ............ | H01L 21/561 174/377 |
| 9,461,001 B1* | 10/2016 | Tsai | ............ | H01L 23/552 |
| 2009/0261468 A1* | 10/2009 | Kroeninger | ............ | H01L 21/568 257/690 |
| 2011/0006408 A1* | 1/2011 | Liao | ............ | H01L 21/561 257/660 |
| 2016/0276307 A1* | 9/2016 | Lin | ............ | H01L 21/561 |

FOREIGN PATENT DOCUMENTS

| | | | |
|---|---|---|---|
| JP | 2003-273571 A | 9/2003 | |
| JP | 2003-298004 A | 10/2003 | |
| JP | 2004-327557 A | 11/2004 | |
| JP | 2017-045932 A | 3/2017 | |

* cited by examiner

*Primary Examiner* — Fernando L Toledo
*Assistant Examiner* — Neil R Prasad
(74) *Attorney, Agent, or Firm* — Young Law Firm, P.C.

(57) ABSTRACT

Disclosed herein is an electronic circuit package that includes a substrate having a power supply pattern, an electronic component mounted on a surface of the substrate; and a molding member having conductivity that covers the surface of the substrate so as to embed the electronic component therein. The power supply pattern includes a first power supply pattern exposed to the surface of the substrate, and the molding member contacts the first power supply pattern.

29 Claims, 16 Drawing Sheets

ELECTRONIC CIRCUIT PACKAGE USING CONDUCTIVE SEALING MATERIAL

BACKGROUND OF THE INVENTION

Field of the Invention

The present invention relates to an electronic circuit package and, more particularly, to an electronic circuit package using a sealing material having conductivity.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

JP 59-132196 A discloses an electronic circuit package to meet the above demand. In the electronic circuit package, an electronic circuit thereof is molded by magnetic mold resin, and the entire body thereof is covered with a metal case, whereby shielding characteristics are improved.

However, in the electronic circuit package disclosed in Japanese Patent Application Laid-Open No. S59-132196, the covering of the entire structure with the metal casing makes reduction in height difficult. Further, the metal casing has a large number of holes formed therein and is not connected to a ground pattern of a substrate, so that a sufficient shielding effect cannot be obtained.

SUMMARY

It is therefore an object of the present invention to provide an electronic circuit package capable of obtaining high shielding characteristics while achieving reduction in height.

An electronic circuit package according to the present invention includes a substrate having a power supply pattern, an electronic component mounted on a surface of the substrate, and a molding member having conductively that covers the surface of the substrate so as to embed the electronic component therein. The power supply pattern includes a first power supply pattern exposed to the surface of the substrate, and the molding member contacts the first power supply pattern.

According to the present invention, the molding member has conductivity, so that a magnetic shielding function can be obtained by the molding member itself.

In the present invention, the occupying ratio of the first power supply pattern in the surface of the substrate may be equal to or higher than 2% or equal to or higher than 8%. By increasing the occupying ratio of the first power supply pattern in the surface of the substrate, shielding characteristics can be enhanced.

In the present invention, the first power supply pattern may be disposed at at least one corner portion of the surface of the substrate. Alternatively, the first power supply pattern may be disposed at at least two corner portions thereof. In this case, the two corner portions may be diagonally opposed to each other. By disposing the first power supply pattern at the corner portion of the substrate, interference between the first power supply pattern and other wiring patterns can be easily avoided.

In the present invention, the first power supply pattern may be disposed along at least one side of the surface of the substrate. Alternatively, the first power supply pattern may be disposed along at least two sides of the surface of the substrate. In this case, the two sides may be opposed to each other. By disposing the first power supply pattern along the side of the substrate, interference between the first power supply pattern and other wiring patterns can be easily avoided.

In the present invention, the power supply pattern may include a second power supply pattern exposed to the side surface of the substrate, and the molding member may further contact the second power supply pattern. This makes the potential of the molding member more stable.

In the present invention, the side surface of the substrate may include a side surface upper part and a side surface lower part protruding from the side surface upper part. The second power supply pattern may be exposed to the side surface upper part of the substrate. The molding member may cover the side surface upper part of the substrate without covering the side surface lower part of the substrate. With the above configuration, the molding member can be connected to the second power supply pattern exposed to the side surface of the substrate before substrate individuation.

The electronic circuit package according to the present invention may further include a metal film that covers the molding member and has higher conductivity than that of the molding member. With this configuration, electromagnetic shielding characteristics can be further enhanced.

In the present invention, the molding member may include a resin material and a first filler blended in the resin material. The surface of the first filler may be covered with a metal coating having higher conductivity than that of the first filler. With this configuration, the molding member has conductivity and magnetism, so that an electromagnetic shielding function can be obtained by the molding member itself. Particularly, when a magnetic material is used as the first filler, a composite shielding structure having both an electromagnetic shielding function and a magnetic shielding function can be obtained.

The electronic circuit package according to the present invention may further include a magnetic film that covers the molding member and has higher permeability than that of the molding member. With this configuration, magnetic shielding characteristics can be further enhanced.

In the present invention, the molding member may further include a second filler having a size smaller than that of the first filler. In this case, the surface of the second filler may be covered with a metal coating. With this configuration, the volume resistivity of the molding member can be further reduced.

In the present invention, the second filer may be formed of a magnetic material, a conductive material, or an insulating material.

In the present invention, the first filler may be formed of a material containing 32 wt. % to 39 wt. % of a metal material composed mainly of Ni in Fe. With this configuration, the thermal expansion coefficient of the molding member can be significantly reduced to, e.g., 15 ppm/° C. or less. This can prevent warpage of the substrate, interfacial peeling in the molding material, cracking of the molding material, and the like.

The electronic circuit package according to the present invention may further include an insulating coating that insulates the electronic component and its terminal electrode from the molding member. With this configuration, a faulty short-circuit between the electronic component and the molding member can be prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
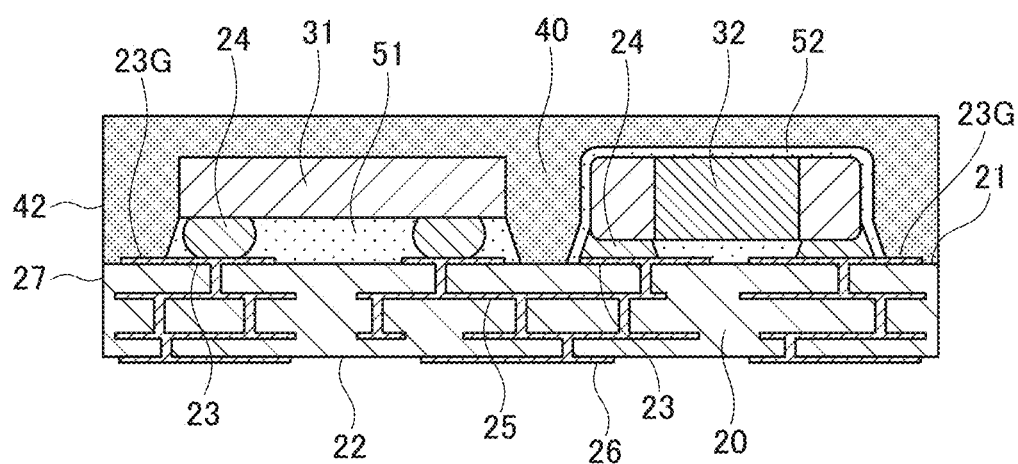
FIG. 1 is a cross-sectional view illustrating a configuration of an electronic circuit package according to a first embodiment of the present invention.

FIG. 1 is a cross-sectional view illustrating a configuration of an electronic circuit package 11 according to the first embodiment of the present invention.

As illustrated in FIG. 1, the electronic circuit package 11 according to the present embodiment includes a substrate 20, a plurality of electronic components 31 and 32 mounted on the substrate 20, and a composite molding member 40 having a conductivity covering a front surface 21 of the substrate 20 so as to embed the electronic components 31 and 32.

Although the type of the electronic circuit package 11 according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet. In addition, a low-resistance metal such as Au, Pd, Ag, Sn, and the like may be formed on the land patterns 23 by means of plating, spattering, evaporating, and the like, or an antioxidizing film such as Cu-OSP and the like may be formed on the land patterns 23.

The electronic components 31, 32, and their terminal electrodes and the solders 24 are covered with insulating coatings 51 and 52, respectively, and thereby insulated from the composite molding member 40. Although the insulating coating 51 is provided between the electronic component 31 and the substrate 20 in the example of FIG. 1, it may be provided so as to cover the entire electronic component 31. On the other hand, the insulating coating 52 is provided so as to cover the entire electronic component 32.

Figure 2:
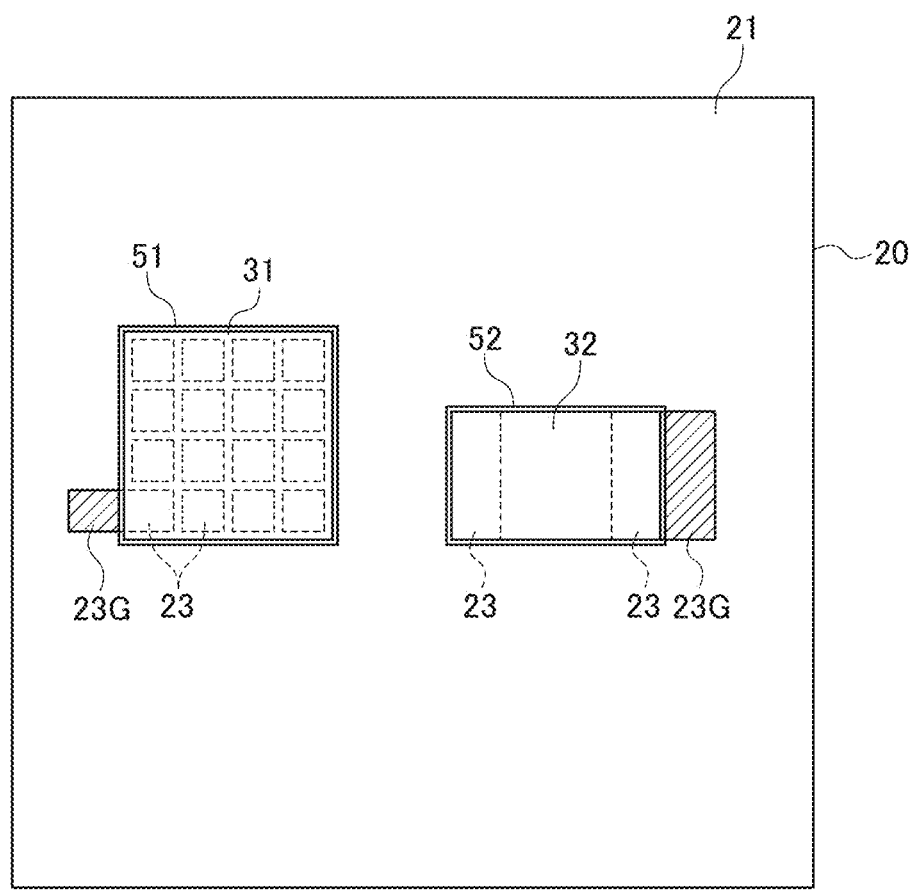
FIG. 2 is a schematic plan view indicating a surface of the substrate shown in FIG. 1.

As illustrated in FIG. 1 and FIG. 2, a power supply pattern 23G led out from the land pattern 23 is exposed without being covered with the insulating coating 51 or 52 and contacts the composite molding member 40. The power supply pattern 23G is typically a ground pattern to which a ground potential is applied, but not limited thereto as long as it is a pattern to which a fixed potential is applied.

The composite molding member 40 covers the front surface 21 of the substrate 20 so as to embed the electronic components 31 and 32 therein. The composite molding member 40 has a conductivity different from a conventional molding member. Thus, the composite molding member 40 serves as an electromagnetic shielding in addition to an ordinary function of a molding member. In the present embodiment, a side surface 42 of the composite molding member 40 and a side surface 27 of the substrate 20 form the same plane. Although details of the composite molding member 40 are described later, it is desired that the composite molding member 40 is made of a composite material having very small thermal expansion coefficient (equal to or lower than 15 ppm/° C., for example) compared with an ordinary molding material.

The higher the occupying ratio of the power supply pattern 23G in the front surface 21 of the substrate 20 is, the higher the shielding characteristics become. This is because the higher the occupying ratio of the power supply pattern 23G in the front surface 21 of the substrate 20 is, the higher the stability of the potential of the composite molding member 40. Considering this point, the occupying ratio of the power supply pattern 23G in the front surface 21 of the substrate 20 is preferably equal to or higher than 2%. On the other hand, when the occupying ratio of the power supply pattern 23G is increased, an area on the surface 21 of the substrate 20 where other wiring patterns can be formed is reduced. Considering this point, the occupying ratio of the power supply pattern 23G in the front surface 21 of the substrate 20 is preferably equal to or lower than 30%.

The following describes a manufacturing method for the electronic circuit package 11 according to the present embodiment.

FIGS. 3 to 7 are process views for explaining a manufacturing method for the electronic circuit package 11.

Figure 3:
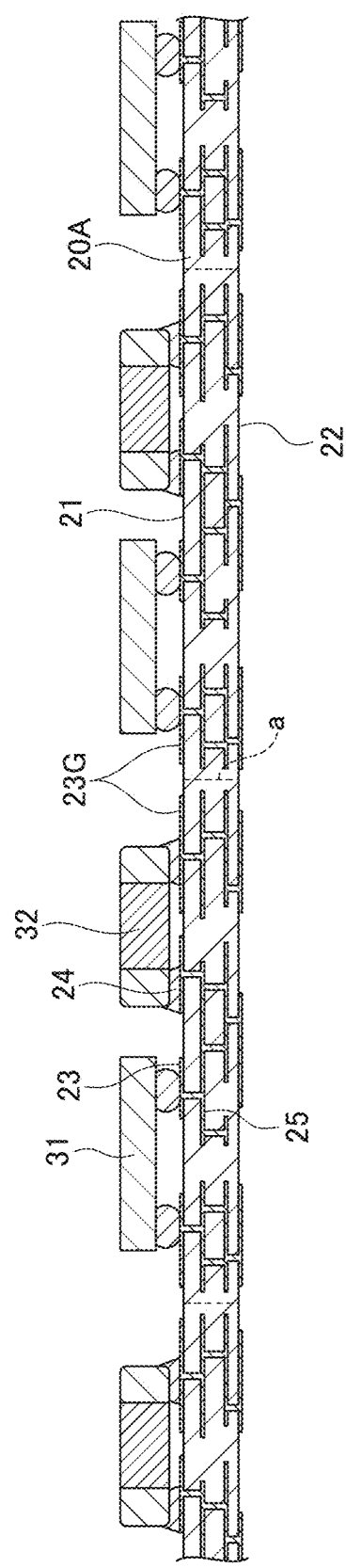
FIGS. 3 to 7 are process views for explaining a manufacturing method for the electronic circuit package shown in FIG. 1.

As illustrated in FIG. 3, an assembly substrate 20A having a multilayer wiring structure is prepared. A plurality of the land patterns 23 and a plurality of the ground patterns 23G are formed on the front surface 21 of the assembly substrate 20A, and a plurality of the external terminals 26 are formed on the back surface 22 of the assembly substrate 20A. Further, a plurality of the internal wirings 25 are formed in an inner layer of the assembly substrate 20A. A dashed line a in FIGS. 3 to 6 denotes a part to be cut in a subsequent dicing process.

Then, as illustrated in FIG. 3, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 4:
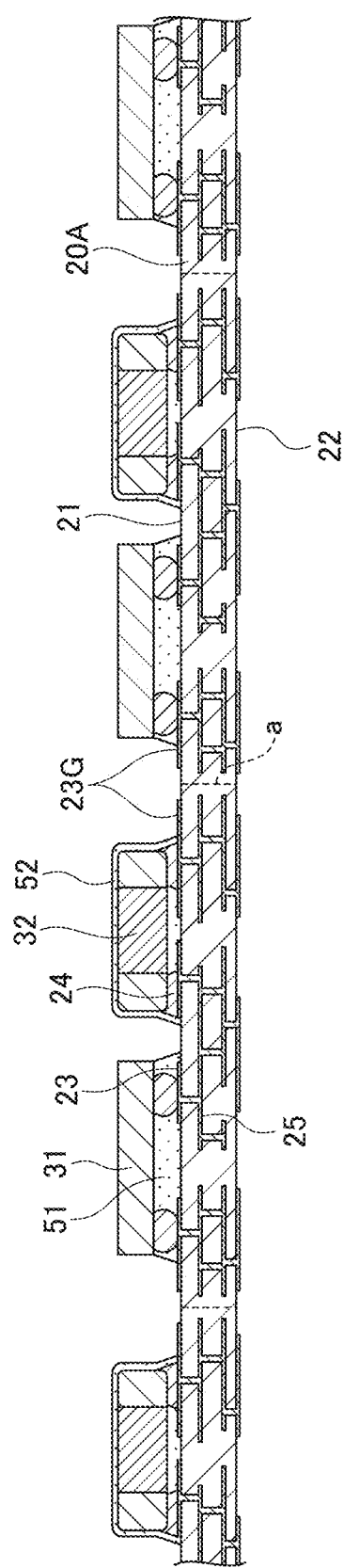

Then, as illustrated in FIG. 4, the electronic components 31, 32, and the terminal electrodes and solders 24 of the respective electronic components 31, 32 are covered with the insulating coatings 51 and 52, respectively. At this time, at least a part of the power supply pattern 23G needs to be exposed without being covered with the insulating coating 51 or 52.

Figure 5:
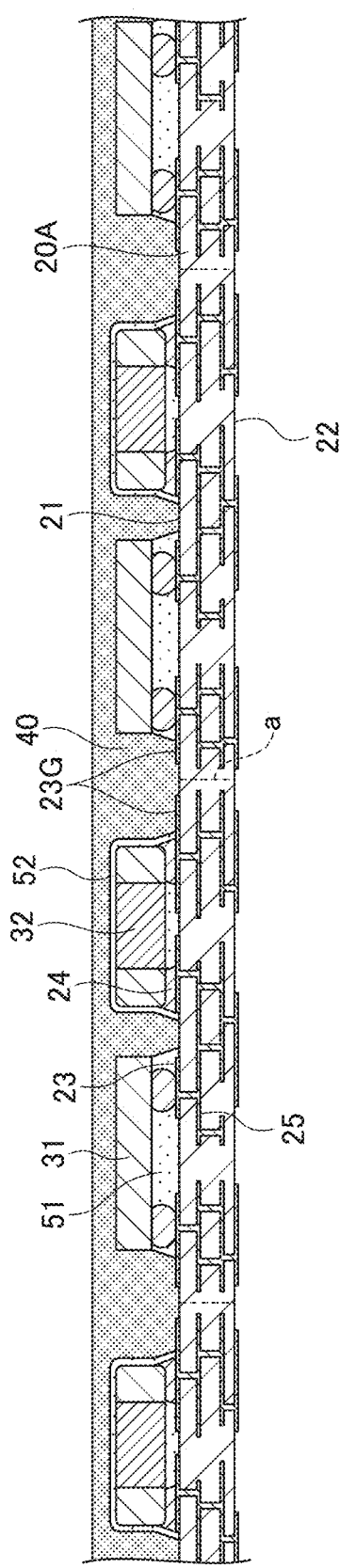
Figure 6:
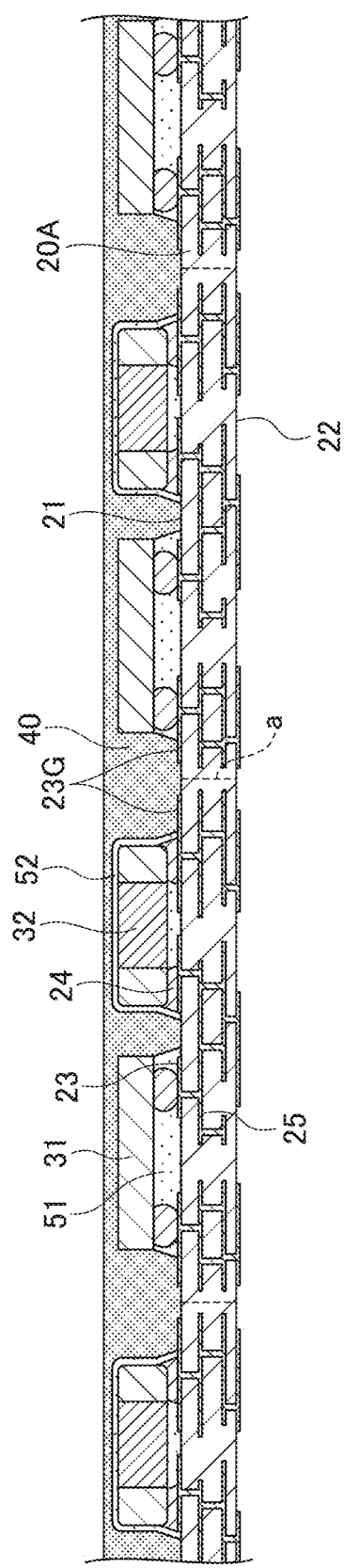

Then, as illustrated in FIG. 5, the molding member 40 is used to cover the surface 21 of the aggregate substrate 20A so as to embed the electronic components 31 and 32 therein. A formation method for the molding member 40 includes transfer molding, compression molding, injection molding, cast molding, vacuum cast molding, dispensing, and a method using a slit nozzle. Thereafter, as illustrated in FIG. 6, the upper surface of the molding member 40 is polished to adjust the thickness of the composite molding member 40. Although the thickness of the composite molding member 40 is not particularly limited, the thickness of the composite molding member 40 at a portion above the tallest electronic component among all the electronic components including the electronic components 31 and 32 is preferably equal to or larger than 50 μm and more preferably equal to or larger than 100 μm. This can sufficiently reduce volume resistivity of the composite molding member 40. However, in the present invention, polishing of the upper surface of the composite molding member 40 is optional.

Figure 7:
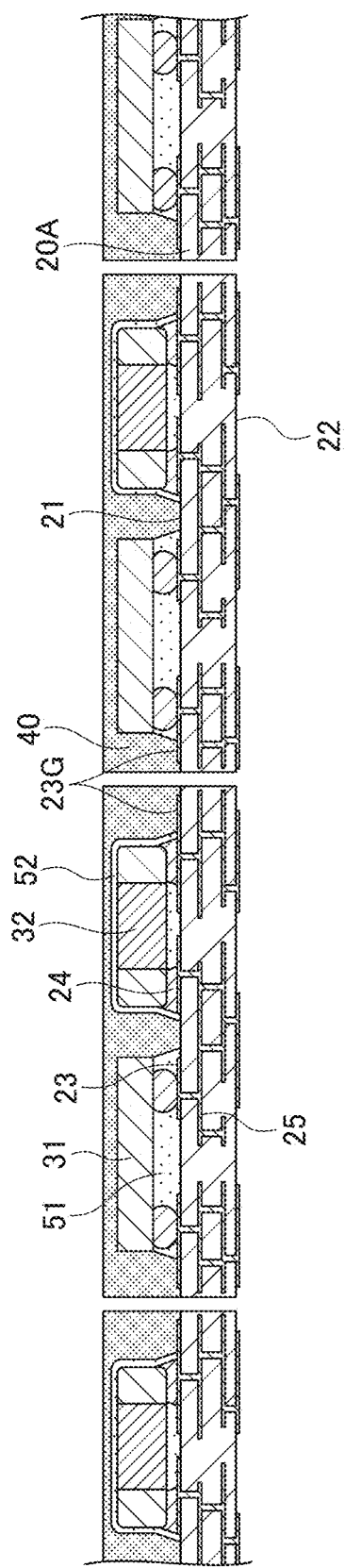

Then, as illustrated in FIG. 7, the aggregate substrate 20A is cut along the dashed lines a into individual substrates 20, whereby the electronic circuit package 11 according to the present embodiment is completed.

As described above, in the electronic circuit package 11 according to the present embodiment, the composite molding member 40 has conductivity, so that the composite molding member 40 itself functions as an electromagnetic shield. As a result, electromagnetic waves emitted from the electronic components 31 and 32 or electromagnetic waves coming from the outside are converted into a current inside the composite molding member 40 to be made to flow outside through the power supply pattern 23G. Further, in the present embodiment, the power supply pattern 23G is exposed to the front surface 21 of the substrate 20, so that it is possible to give a fixed potential to the composite molding member 40 only by forming the composite molding member 40 so as to cover the front surface 21 of the substrate 20.

Figure 8:
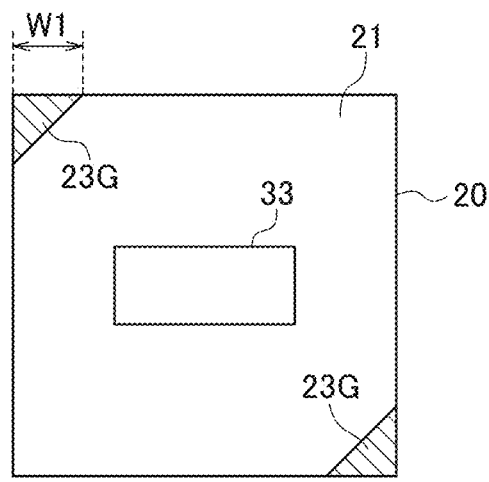
FIG. 8 is a schematic plan view indicating a first example of a layout of a power supply pattern on the surface of the substrate.
Figure 9:
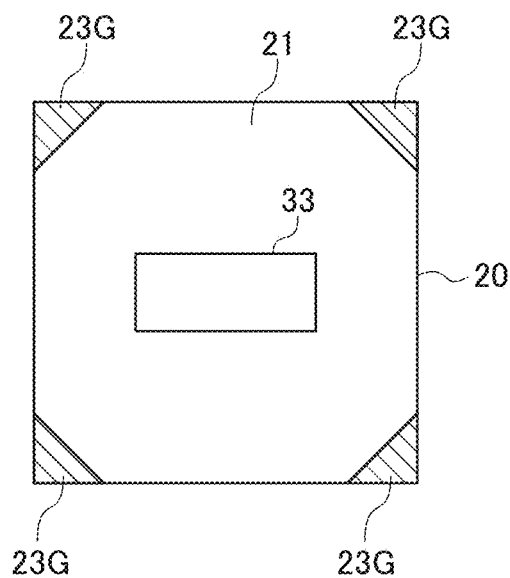
FIG. 9 is a schematic plan view indicating a second example of a layout of a power supply pattern on the surface of the substrate.

Further, in the example illustrated in FIG. 2, the power supply pattern 23G led out from the land pattern 23 contacts the composite molding member 40; however, it is not essential to integrally form the power supply pattern 23G and the land pattern 23 on the front surface 21 of the substrate 20. That is, the power supply pattern 23G may be formed independently of the land pattern 23. Further, the position of the power supply pattern 23G on the front surface 21 of the substrate 20 is not particularly limited. For example, as illustrated in FIG. 8, the power supply pattern 23G may be disposed near the corner portion of the front surface 21 of the substrate 20. In the example of FIG. 8, an electronic component 33 is mounted at the center portion of the front surface 21 of the substrate 20, and the power supply pattern 23G is disposed near the two orthogonal corner portions of the front surface 21 of the substrate 20. Further, as illustrated in FIG. 9, the power supply pattern 23G may be disposed near all the corner portions of the front surface 21 of the substrate 20. The area near the corner portion of the front surface 21 of the substrate 20 often has a lower wiring pattern formation density than that of the center area thereof, so that when the power supply pattern 23G is disposed at this area, area overhead can be minimized.

Figure 10:
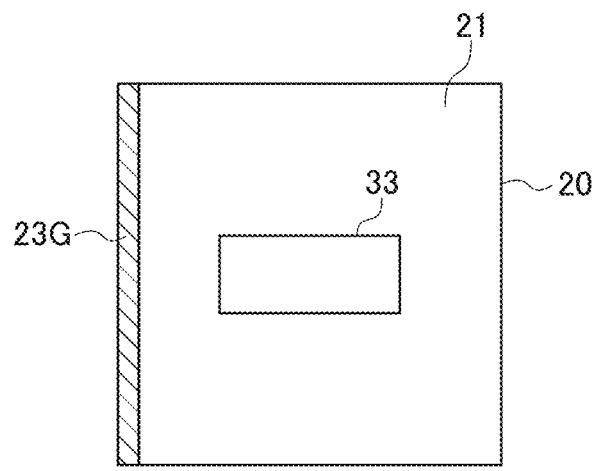
FIG. 10 is a schematic plan view indicating a third example of a layout of a power supply pattern on the surface of the substrate.
Figure 11:
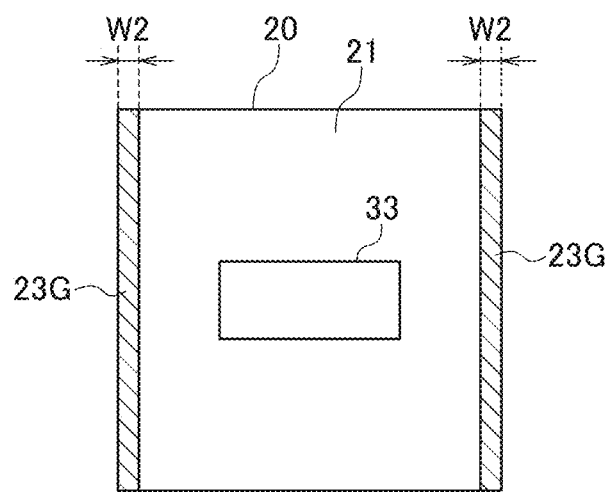
FIG. 11 is a schematic plan view indicating a fourth example of a layout of a power supply pattern on the surface of the substrate.
Figure 12:
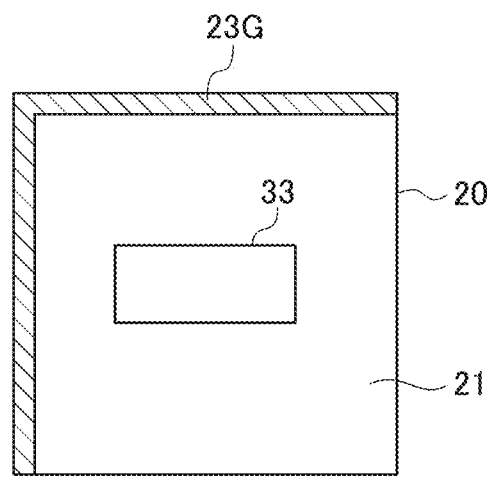
FIG. 12 is a schematic plan view indicating a fifth example of a layout of a power supply pattern on the surface of the substrate.
Figure 13:
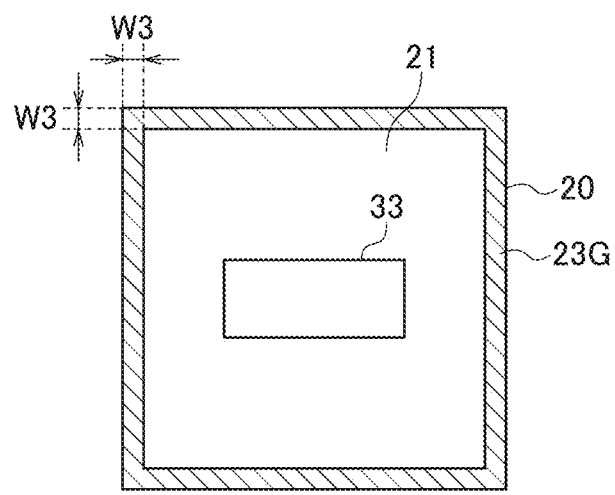
FIG. 13 is a schematic plan view indicating a sixth example of a layout of a power supply pattern on the surface of the substrate.

Further, as illustrated in FIG. 10, the power supply pattern 23G may be disposed along one side of the front surface 21 of the substrate 20. The area near the outer periphery of the front surface 21 of the substrate 20 often has a lower wiring pattern formation density than that of the center area thereof, so that when the power supply pattern 23G is disposed at this area, area overhead can be minimized. In addition, it is possible to secure a sufficient area for the power supply pattern 23G as compared to a case where the power supply pattern 23G is disposed near the corner portion. When the area for the power supply pattern 23G is insufficient, the power supply pattern 23G may be disposed along the two opposing sides, as illustrated in FIG. 11, may be disposed along the two adjacent sides as illustrated in FIG. 12, or may be disposed along all the sides as illustrated in FIG. 13.

Next, a molding material constituting the composite molding member 40 will be described in detail.

The molding material constituting the molding member 40 has conductivity unlike general molding materials. The composite molding member 40 is connected to the power supply pattern 23G and is thus applied with a fixed potential such as ground potential. This allows the composite molding member 40 itself to have an electromagnetic shield function. In order to sufficiently exhibit the electromagnetic shielding effect, the volume resistivity of the conductive molding member 40 is preferably equal to or less than $1\times10^{-4}$ $\Omega\cdot$cm.

The composite molding member 40 includes a binder and a first filler. Although not especially limited, the resin binder preferably composed mainly of a thermosetting resin material. Specifically, the binder is preferably composed mainly of an epoxy resin, a phenol resin, a urethane resin, a silicone resin, or an imide resin and more preferably uses a base resin and a curing agent used for an epoxy resin-based or a phenol resin-based semiconductor sealing material.

The most preferable is the epoxy resin having a reactive epoxy group at its terminal, which can be combined with various types of curing agents and curing accelerators. Examples of the epoxy resin include a bisphenol A epoxy resin, a bisphenol F epoxy resin, a phenoxy type epoxy resin, a naphthalene type epoxy resin, a multifunctional-type epoxy resin (dicyclopentadiene type epoxy resin, etc.), a biphenyl-type (bifunctional) epoxy resin, and an epoxy resin having a special structure. Among them, the biphenyl type epoxy resin, naphthalene type epoxy resin, and dicyclopentadiene type epoxy resin are useful since they can attain low thermal expansion. Examples of the curing agent or curing accelerator include amine-based compound alicyclic diamine, aromatic diamine, other amine-based compounds (imidazole, tertiary amine, etc.), an acid anhydride compound (high-temperature curing agent, etc.), a phenol resin (novolac type phenol resin, cresol novolac type phenol resin, etc.), an amino resin, dicyandiamide, and a Lewis acid complex compound. For material kneading, known means such as a kneader, three-roll mills, or a mixer may be used.

Figure 14:
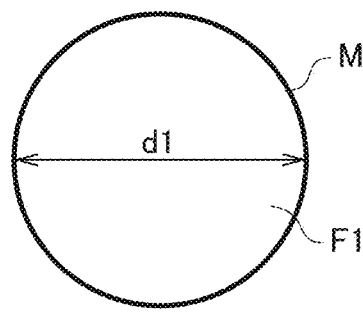
FIG. 14 is a cross-sectional view for explaining a structure of a first filler.

FIG. 14 is a cross-sectional view illustrating an example of the first filler F1. It is preferable that the first filler F1 has a median diameter (D50) of d1 and the surface thereof is applied with a metal coating M having higher conductivity than that of the first filler F1. Applying the metal coating M to the surface of the first filler F1 allows the volume resistivity of the composite molding member 40 to be reduced further. The metal coating M is mainly composed of Au, Ag, Al, Mg, W, Mo, Zn, Ni, Fe, Pt, Pd, Sn, or Cu. Among them, Ag or Au hardly subjected to oxidative degradation and having low electric resistivity is preferably used. In order to further reduce the volume resistivity of the composite molding member 40, the electric resistivity of the metal coating M is preferably equal to or less than $1\times10^{-6}$ $\Omega\cdot$cm. The thickness of the metal coating M to be formed on the first filler F1 is preferably in a range of 1 nm to 3000 nm. Further, the volume resistivity of the first filler F1 applied with the metal coating M in a powdery state is preferably equal to or less than $1\times10^{-3}$ $\Omega\cdot$cm at a pressure of 25 Mpa.

Although the material of the first filler F1 is not particularly limited, the first filler F1 is formed of a magnetic material such as permalloy, a conductive material such as metal, or an insulating material such as molten silica. Particularly, the first filler F1 is preferably formed of a magnetic material. More preferably, the first filler F1 is formed of an Fe—Ni based material and contains 32 wt. % to 39 wt. % of a soft magnetic metal material composed mainly of Ni. The remaining 61 wt. % to 68 wt. % is Fe. Such an Fe—Ni based material is called "Invar material". Using the Invar material for the first filler F1 can make the thermal expansion coefficient of the composite molding member 40 equal to or less than, e.g., 15 ppm/° C. and can achieve high magnetic characteristics. The soft magnetic metal material composed mainly of Ni may contain a small amount of Co. That is, a part of Ni may be substituted with Co. The containing of Co enables a further reduction in the thermal expansion coefficient of the composite magnetic sealing material. The adding amount of Co to the overall weight of the first filler F1 is preferably 0.1 wt. % or more and 8 wt. % or less.

When a conductive material is used as the material of the first filler F1, known metal powder such as Ag powder, Cu powder, or Sn powder may be used. In terms of cost, a magnetic material or an insulating material is preferably used as the material of the first filler F1. When an insulating material is used as the material of the first filler F1, a known material such as calcium carbonate, talc, silica, clay, alumina, AlN, BN, BeO, barium sulfate, aluminum hydroxide, magnesium hydroxide, antimony oxide, glass, titanium oxide, barium titanate, or heat resistant resin may be used. Preferably, at least one material selected from a group consisting of $SiO_2$, $ZrW_2O_8$, $(ZrO)_2P_2O_7$, $KZr_2(PO_4)_3$ and $Zr_2(WO_4)(PO_4)_2$. These materials each have a very low or negative thermal expansion coefficient, allowing the thermal expansion coefficient of the composite molding material to be reduced.

The shape of the first filler F1 is not especially limited. However, the magnetic filler 6 may preferably be formed into a spherical shape for high packing density. Further, fillers of different particle sizes may be blended as the first filler F1 for closest packing. Further, forming the first filler F1 into a spherical shape or substantially a spherical shape enables a reduction in damage to electronic components during molding. Particularly, for high packing density or closest packing, the shape of the first filler F1 is preferably a true sphere. The first filler F1 preferably has a high tap density and a small specific surface area. As a formation method for the first filler F1 made of a magnetic material, there are known a water atomization method, a gas atomization method, and a centrifugal disc atomization method. Among them, the gas atomization method is most preferable since it can achieve a high tap density and reduce the specific surface area.

The composite molding member 40 may contain, in addition to the first filler F1, a second filler F2a (FIG. 15A) formed of a magnetic material, a second filler F2b (FIG. 15B) formed of a conductive material, or a second filler F2c (FIG. 15C) formed of an insulating material. A median diameter d2 of each of the second filler F2a, F2b, and F2c is smaller than the median diameter d1 of the first filler F1. This can increase the filling rate of the filler contained in the composite molding member 40. The surfaces of the respective second fillers F2a, F2b, and F2c are also preferably covered with the metal coating M. This can further reduce the volume resistivity of the composite molding member 40. The material and thickness of the metal coating M may be the same as those of the metal coating M to be applied to the first filler F1. Further, the volume resistivity of the second filler F2 applied with the metal coating M in a powdery state is preferably equal to or less than $1 \times 10^{-4}$ Ω·cm at a pressure of 25 Mpa. The blending ratio of the total filler (including the first filler F1 and second filler F2a, F2b, or F2c) to the binder is preferably 50 vol. % to 85 vol. %. Further, the blending ratio of the first filler F1 to the total filler is preferably 50 vol. % to 99 vol. %. Further, the first and second fillers F1 and F2 are blended such that the volume resistivity of a mixture of the first filler F1 applied with the metal coating M and second filler F2 applied with the metal coating M in a powdery state is preferably equal to or less than $1 \times 10^{-4}$ Ω·cm at a pressure of 25 Mpa.

Figure 15A:
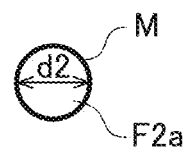
FIGS. 15A to 15C are cross-sectional views for explaining a structure of a second filler.

The second filler F2a illustrated in FIG. 15A is formed of a magnetic material. The magnetic material constituting the second filler F2a may be composed of at least one material selected from a group consisting of Fe, an Fe—Co based alloy, an Fe—Ni based alloy, an Fe—Al based alloy, an Fe—Si based alloy, an Ni—Zn based spinel ferrite, an Mn—Zn based spinel ferrite, an Ni—Cu—Zn based spinel ferrite, an Mg based spinel ferrite, and an yttrium iron based garnet ferrite. Particularly, as the magnetic material constituting the second filler F2a, the Invar material is preferably used. Using the Invar material for the second filler F2a can make the thermal expansion coefficient of the composite molding member 40 equal to or less than, e.g., 15 ppm/° C. and can achieve high magnetic characteristics. The soft magnetic metal material composed mainly of Ni may contain a small amount of Co. That is, a part of Ni may be substituted with Co. The containing of Co enables a further reduction in the thermal expansion coefficient of the composite magnetic sealing material. The adding amount of Co to the overall weight of the second filler F2a is preferably 0.1 wt. % or more and 8 wt. % or less. The material of the second filler F2a may be the same as that of the first filler F1. The thickness of the metal coating M to be formed on the second filler F2a is preferably in a range of 1 nm to 2000 nm.

Figure 15B:
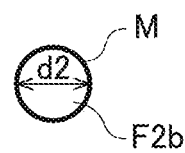

The second filler F2b illustrated in FIG. 15B is formed of a conductive material. The conductive material may be composed of mainly Au, Ag, Al, Mg, W, Mo, Zn, Ni, Fe, Pt, Pd, Sn, or Cu. Even when the conductive material is used as the material of the second filler F2b, the surface of the second filler F2b may be covered with the metal coating M.

Figure 15C:
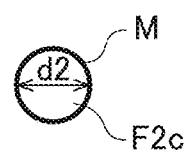

The second filler F2c illustrated in FIG. 15C is formed of an insulating material. As the insulating material of the second filler F2c, a known insulating material such as calcium carbonate, talc, silica, clay, alumina, AlN, BN, BeO, barium sulfate, aluminum hydroxide, magnesium hydroxide, antimony oxide, glass, titanium oxide, barium titanate, or heat resistant resin may be used. The heat resistant resin may be thermosetting resin or thermoplastic resin. Particularly, a material having a smaller thermal expansion coefficient than that of the first filler F1 or a material having a negative thermal expansion coefficient, such as $SiO_2$, $ZrW_2O_8$, $(ZrO)_2P_2O_7$, $KZr_2(PO_4)_3$ or $Zr_2(WO_4)(PO_4)_2$ is preferably used. When the above second filler F2c is added to the composite molding member 40, the thermal expansion coefficient can be further reduced. Further, the following materials may be added: flame retardant such as aluminum oxide or magnesium oxide; carbon black, pigment, or dye for coloring; surface-treated nanosilica having a particle diameter of 100 nm or less for enhancement of slidability, flowability, and dispersibility/kneadability; and a wax component for enhancement of mold releasability. The thickness of the metal coating M to be formed on the second filler F2c is preferably in a range of 1 nm to 2000 nm. In the present invention, the composite material constituting the composite molding member 40 need not necessarily contain the second filler F1a, F2b, or F2c.

The composite material constituting the composite molding member 40 may be a liquid or solid, depending on selection of a base resin and a curing agent according to the molding method therefor. The composite material in a solid state may be formed into a tablet shape for transfer molding and into a granular shape for injection molding or compression molding. The molding method using the composite material may be appropriately selected from among the followings: transfer molding; compression molding; injection molding; cast molding; vacuum cast molding; vacuum printing; printing; dispensing; and a method using a slit nozzle. A molding condition may be appropriately selected from combinations of the base resin, curing agent and curing accelerator to be used. Further, after-cure treatment may be applied as needed after the molding.

As described above, since the first filler F1 is formed of an Invar material, it is possible to prevent warpage of the substrate, interfacial peeling in the molding material, cracking of the molding material, and the like due to a temperature change while ensuring magnetic shielding characteristics.

Second Embodiment

Figure 16:
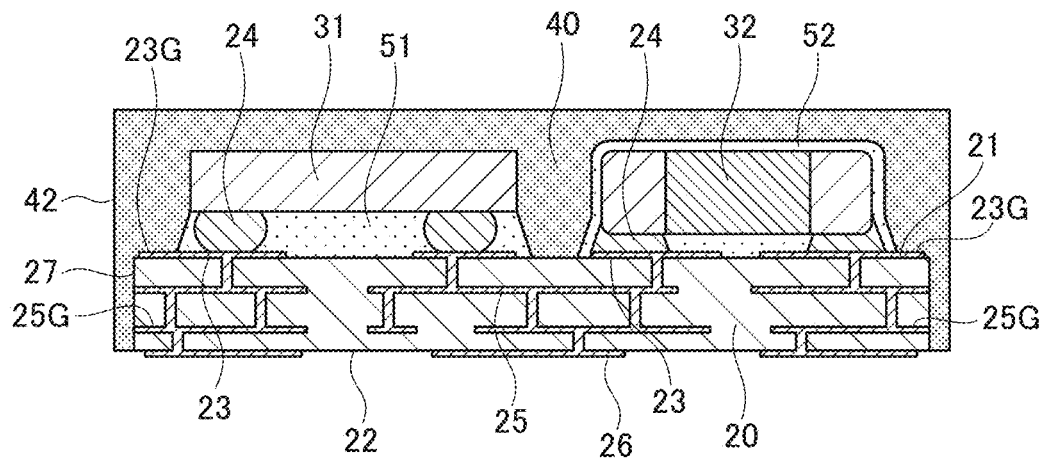
FIG. 16 is a cross-sectional view illustrating a configuration of an electronic circuit package according to a second embodiment of the present invention.

FIG. 16 is a cross-sectional view illustrating the configuration of an electronic circuit package 12 according to the second embodiment of the present invention.

As illustrated in FIG. 16, in the electronic circuit package 12 according to the present embodiment, the planar size of the composite molding member 40 is slightly larger than the planar size of the substrate 20 and, thus, the side surface 27 of the substrate 20 is covered with the composite molding member 40. To the side surface 27 of the substrate 20, a power supply pattern 25G constituting a part of an internal wiring 25 is exposed, and the exposed power supply pattern 25G and the composite molding member 40 contact each other. As a result, the composite molding member 40 is applied with a fixed potential (typically, a ground potential) through the power supply pattern 25G. Other configurations are the same as those of the electronic circuit package 11 according to the first embodiment, so the same reference numerals are given to the same elements, and overlapping description will be omitted.

In the electronic circuit package 12 according to the present embodiment, the composite molding member 40 is connected to the power supply pattern 23G at the upper surface 21 of the substrate 20 and to the power supply pattern 25G at the side surface 27 of the same, so that it is possible to make the potential (typically, a ground potential) of the composite molding member 40 more stable than in the electronic circuit package 11 according to the first embodiment.

The electronic circuit package 12 according to the present embodiment can be manufactured by cutting the aggregate substrate 20A into individual substrates 20 and then forming the composite molding member 40 on the upper and side surfaces 21 and 27 of the substrate 20.

Third Embodiment

Figure 17:
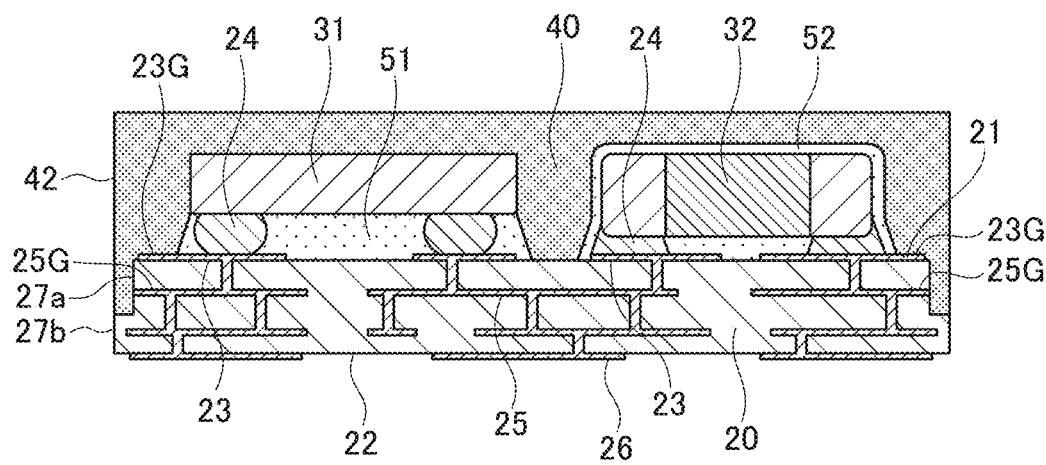
FIG. 17 is a cross-sectional view illustrating a configuration of an electronic circuit package according to a third embodiment of the present invention.

FIG. 17 is a cross-sectional view illustrating the configuration of an electronic circuit package 13 according to the third embodiment of the present invention.

As illustrated in FIG. 17, in the electronic circuit package 13 according to the present embodiment, the side surface 27 of the substrate 20 is formed into a step shape. Specifically, the side surface 27 has a shape in which a side surface lower part 27b protrudes from a side surface upper part 27a. To the side surface upper part 27a, the power supply pattern 25G is exposed, and the exposed power supply pattern 25G and the composite molding member 40 contact each other. The power supply pattern 25G is not exposed to the side surface lower part 27b, and the side surface lower part 27b and a side surface 42 of the composite molding member 40 constitute the same plane. Other configurations are the same as those of the electronic circuit package 12 according to the second embodiment, so the same reference numerals are given to the same elements, and overlapping description will be omitted.

The electronic circuit package 13 according to the present embodiment can be manufactured by forming a groove constituting the side surface upper part 27a in the aggregate substrate 20A, then forming the composite molding member 40 in the upper surface 21 of the substrate 20 so as to fill the groove therewith, and afterwards cutting the aggregate substrate 20A into individual substrates 20.

Fourth Embodiment

Figure 18:
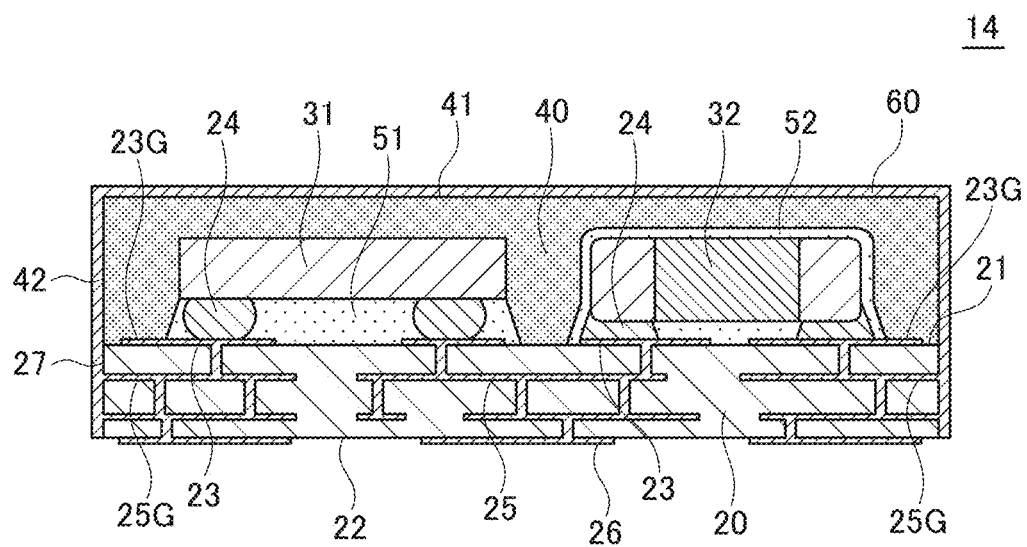
FIG. 18 is a cross-sectional view illustrating a configuration of an electronic circuit package according to a fourth embodiment of the present invention.

FIG. 18 is a cross-sectional view illustrating the configuration of an electronic circuit package 14 according to the fourth embodiment of the present invention.

As illustrated in FIG. 18, the electronic circuit package 14 according to the present embodiment differs from the electronic circuit package 11 according to the first embodiment in that a metal film 60 is additionally formed so as to cover the upper and side surfaces 41 and 42 of the composite molding member 40 and the side surface 27 of the substrate 20. To the side surface 27 of the substrate 20, the power supply pattern 25G is exposed, and the exposed power supply pattern 25G contacts the metal film 60. Other configurations are the same as those of the electronic circuit package 11 according to the first embodiment, so the same reference numerals are given to the same elements, and overlapping description will be omitted.

The metal film 60 serves as an electromagnetic shielding as well as the composite molding member 40 and is preferably mainly composed of at least one metal selected from a group consisting of Au, Ag, Cu, and Al. The metal film 60 preferably has a resistance as low as possible and most preferably uses Cu in terms of cost. It is necessary that the resistivity of the metal film 60 is lower than at least the resistivity of the composite molding member 40. An outer surface of the metal film 60 is preferably covered with an anticorrosive metal such as SUS, Ni, Cr, Ti, or brass or an antioxidant film made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As described above, the electronic circuit package 14 according to the present embodiment includes the metal film 60 connected to the power supply pattern 25G, so that it is possible to make the potential (typically, a ground potential) of the composite molding member 40 more stable than in the electronic circuit package 11 according to the first embodiment.

Fifth Embodiment

Figure 19:
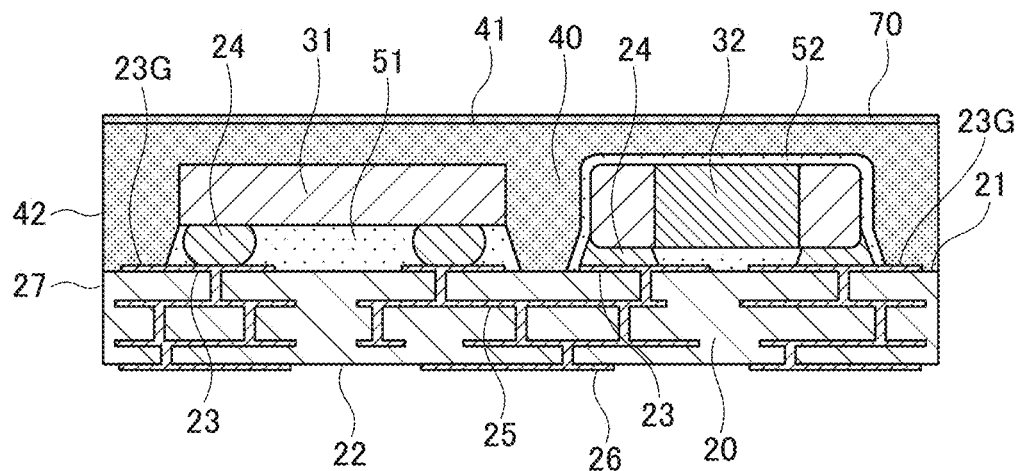
FIG. 19 is a cross-sectional view illustrating a configuration of an electronic circuit package according to a fifth embodiment of the present invention.

FIG. 19 is a cross-sectional view illustrating the configuration of an electronic circuit package 15 according to the fifth embodiment of the present invention.

As illustrated in FIG. 19, the electronic circuit package 15 according to the present embodiment differs from the electronic circuit package 11 according to the first embodiment in that a magnetic film 70 is additionally formed so as to cover the upper surface 41 of the composite molding member 40. Other configurations are the same as those of the electronic circuit package 11 according to the first embodiment, so the same reference numerals are given to the same elements, and overlapping description will be omitted.

The magnetic film 70 is a film formed of a composite magnetic material in which magnetic fillers are dispersed in a thermosetting resin material, a thin film formed of a soft magnetic material or a ferrite, or a foil or a bulk sheet and serves as a second magnetic shield. The effective permeability of the magnetic film 70 needs to be higher than that of the composite molding member 40 and is preferably twice or more higher than it.

When a film formed of a composite magnetic material is selected as the magnetic film 70, an epoxy resin, a phenol resin, a silicone resin, a diallyl phthalate resin, a polyimide resin, an urethane resin, and the like may be used as the thermosetting resin material, and the magnetic film 70 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material can enhance reliability required for electronic circuit packages such as heat resistance, insulating performance, impact resistance, falling resistance, and the like.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be exemplified. As specific examples, a ferrite such as an Ni—Zn ferrite, an Mn—Zn ferrite, an Ni—Cu—Zn ferrite, a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, an Fe—Ni—Co alloy, and Fe, and the like may be exemplified. The shape of the magnetic filler is not particularly limited; however, it may be formed into a spherical shape for a high filling level, and fillers having a plurality of different particle size distributions may be blended or combined for a densest filling structure. In order to maximize a shield effect by a permeability real component and a thermal conversion effect of a loss by a permeability imaginary component, it is more preferable to form the magnetic filler by making flat powder having an aspect ratio of 5 or more orientate.

The surface of the magnetic filler is insulation-coated by an oxide of a metal such as Si, Al, Ti, or Mg, or an organic material for enhancing fluidity and adhesion. For the insulating coating, an oxide film may be formed by coating a thermosetting material on the surface of the magnetic filler or dehydration reaction of a metal alkoxide, and formation of a silicon oxide coating film is most preferable. It is more preferable to apply an organofunctional coupling treatment on the coating film thus formed.

The composite magnetic material can be formed on the upper surface 41 of the composite molding member 40 using a known method such as a printing method, a molding method, a slit nozzle coating method, a spray method, a dispensing method, or a lamination method using an uncured sheet-like resin.

When the thin film formed of a soft magnetic material or a ferrite is selected as the magnetic film 70, one or two or more metals selected from a group consisting of Fe, Ni, Zn, Mn, Co, Cr, Mg, Al, and Si and oxides thereof may be used. In this case, the magnetic film 70 can be formed on the upper surface 41 of the composite molding member 40 by using a plating method, a spray method, an AD method, and a thermal spraying method, as well as a thin-film formation method such as a sputtering method or a vapor-deposition method. In this case, the material for the magnetic film 70 may be appropriately selected based on a required permeability and frequency; however, in order to enhance a shield effect on a lower frequency side (kHz to 100 MHz), an alloy of Fe—Co, Fe—Ni, Fe—Al, or Fe—Si is most preferably used. On the other hand, in order to enhance a shield effect on a higher frequency side (50 to several hundreds of MHz), a ferrite film formed of NiZn, MnZn, or NiCuZn, or Fe is most preferably used.

When a foil or a bulk sheet is used as the magnetic film 70, it is possible to directly form the magnetic film 70 consisting of a foil or a bulk sheet on the upper surface 41 of the composite molding member 40 by previously setting the foil or bulk sheet in a mold for forming the composite molding member 40.

Figure 20:
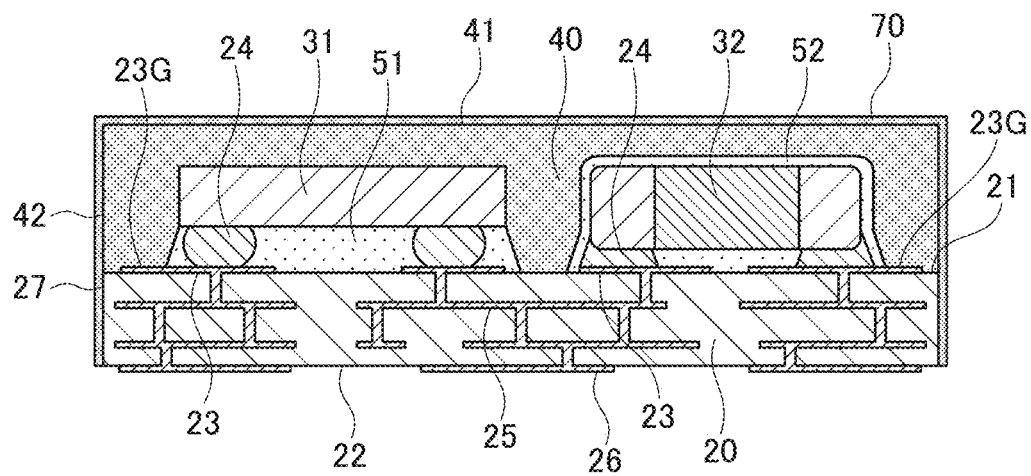
FIG. 20 is a cross-sectional view illustrating a configuration of an electronic circuit package according to a modification of the fifth embodiment of the present invention.

As described above, in the electronic circuit package 15 according to the present embodiment, the magnetic film 70 having a higher permeability than that of the composite molding member 40 is formed on the upper surface 41 of the composite molding member 40, so that magnetic shielding characteristics can be further enhanced. Further, as exemplified by an electronic circuit package 15A shown in FIG. 20 according to a modification, the magnetic film 70 may be used to cover not only the upper surface 41 of the composite molding member 40, but also the side surface 42 of the composite molding member 40 and/or the side surface 27 of the substrate 20. With this configuration, it is possible to further enhance magnetic shielding characteristics in the side surface direction.

Sixth Embodiment

Figure 21:
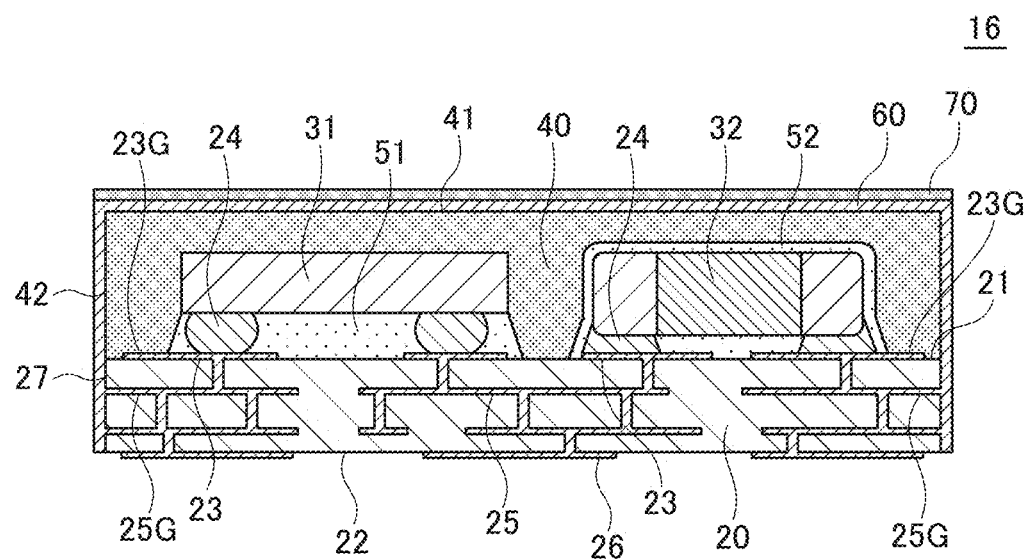
FIG. 21 is a cross-sectional view illustrating a configuration of an electronic circuit package according to a sixth embodiment of the present invention.

FIG. 21 is a cross-sectional view illustrating the configuration of an electronic circuit package 16 according to the sixth embodiment of the present invention.

As illustrated in FIG. 21, the electronic circuit package 16 according to the present embodiment differs from the electronic circuit package 14 according to the fourth embodiment in that the magnetic film 70 is additionally formed so as to cover the upper surface 41 of the composite molding member 40 through the metal film 60. Other configurations are the same as those of the electronic circuit package 14 according to the fourth embodiment, so the same reference numerals are given to the same elements, and overlapping description will be omitted.

In the electronic circuit package 16 according to the present embodiment, the surface of the composite molding member 40 serving as an electromagnetic shield and a magnetic shield is covered with the metal film 60 serving as an electromagnetic shield and the magnetic film 70 serving as a magnetic shield, so that it is possible to further enhance electromagnetic shielding characteristics and magnetic shielding characteristics.

While the preferred embodiments of the present invention have been described, the present invention is not limited thereto. Thus, various modifications may be made without departing from the gist of the invention, and all of the modifications thereof are included in the scope of the present invention.

EXAMPLES

First filler F1 having a median diameter (D50) of 10 μm and second filler F2c having a median diameter (D50) of 0.7 μm were prepared. The first filler F1 was formed of an Invar material with 64 wt. % of Fe and 36 wt. % of Ni, and an Ag having 50 nm thickness was plated on the surface thereof. The second filler F2c was formed of a heat resistant resin, and Ag having a thickness of 80 nm was plated on the surface thereof.

Then, a biphenyl type epoxy resin, a phenol novolac type curing agent, and a catalyst (imidazole) were dissolved in butyl carbitol to prepare a binder. The above first filler F1 and second filler F2c were put into the binder, followed by stirring and kneading in a kneader, to obtain a pasty composite sealing material. The blending ratios of the first filler F1, second filler F2c, and binder in the composite sealing material were 50 vol. %, 25 vol. %, and 25 vol. %, respectively.

Then, samples 1 and 2 having the same structure as that of the electronic circuit package 11 were actually produced using the substrate 20 illustrated in FIG. 8. As the substrate 20, a multilayer resin substrate having a planar size of 7.72 mm×7.72 mm and a thickness of 0.3 mm was used. The width W1 of the power supply pattern 23G illustrated in FIG. 8 was set to 1.18 mm in the sample 1, and the width W1 of the power supply pattern 23G illustrated in FIG. 8 was set to 2.26 mm in the sample 2. Thus, the areas of the respective power supply patterns 23G in the samples 1 and 2 were 1.4 mm$^2$ and 5.1 mm$^2$. In the sample 1, the occupying ratio of the power supply pattern 23G in the front surface 21 of the substrate 20 was about 2.3%. In the sample 2, the occupying ratio of the power supply pattern 23G in the front surface 21 of the substrate 20 was about 8.6%.

Further, a sample 3 having the same structure as that of the electronic circuit package 11 was actually produced using the substrate 20 illustrated in FIG. 11. The planar size and thickness of the substrate 20 were the same as those in the samples 1 and 2. The width W2 of the power supply pattern 23G illustrated in FIG. 11 was set to 0.52 mm. Thus, the area of the power supply pattern 23G was 8.0 mm$^2$, and the occupying area of the power supply pattern 23G in the front surface 21 of the substrate 20 was about 13.5%.

Further, a sample 4 having the same structure as that of the electronic circuit package 11 was actually produced using the substrate 20 illustrated in FIG. 13. The planar size and thickness of the substrate 20 were the same as those in the samples 1 and 2. The width W3 of the power supply pattern 23G illustrated in FIG. 13 was set to 0.44 mm. Thus, the area of the power supply pattern 23G was 12.8 mm$^2$, and the occupying area of the power supply pattern 23G in the front surface 21 of the substrate 20 was about 21.5%.

As the composite molding member 40 in each of the samples 1 to 4, the above composite sealing material was used to form the composite molding member 40 on the upper surface 21 of the substrate 20 by a vacuum printing method, followed by heating at 100° C. for four hours for removal of solvent and then post-curing at 180° C. for three hours.

As a comparative example, in place of the above composite molding member, a general molding material having neither magnetism nor conductivity was used for molding, and then a Cu film of a 6 μm thickness was formed on the surface of the obtained molding member by a sputtering method, whereby a comparative sample was obtained. The Cu film was connected to a ground pattern.

Then, the above samples were each reflow-mounted on a characteristic evaluation substrate, and a neighboring magnetic field measuring apparatus was used to measure a noise attenuation amount for evaluation of shielding characteristics. The results are illustrated in FIG. 22.

Figure 22:
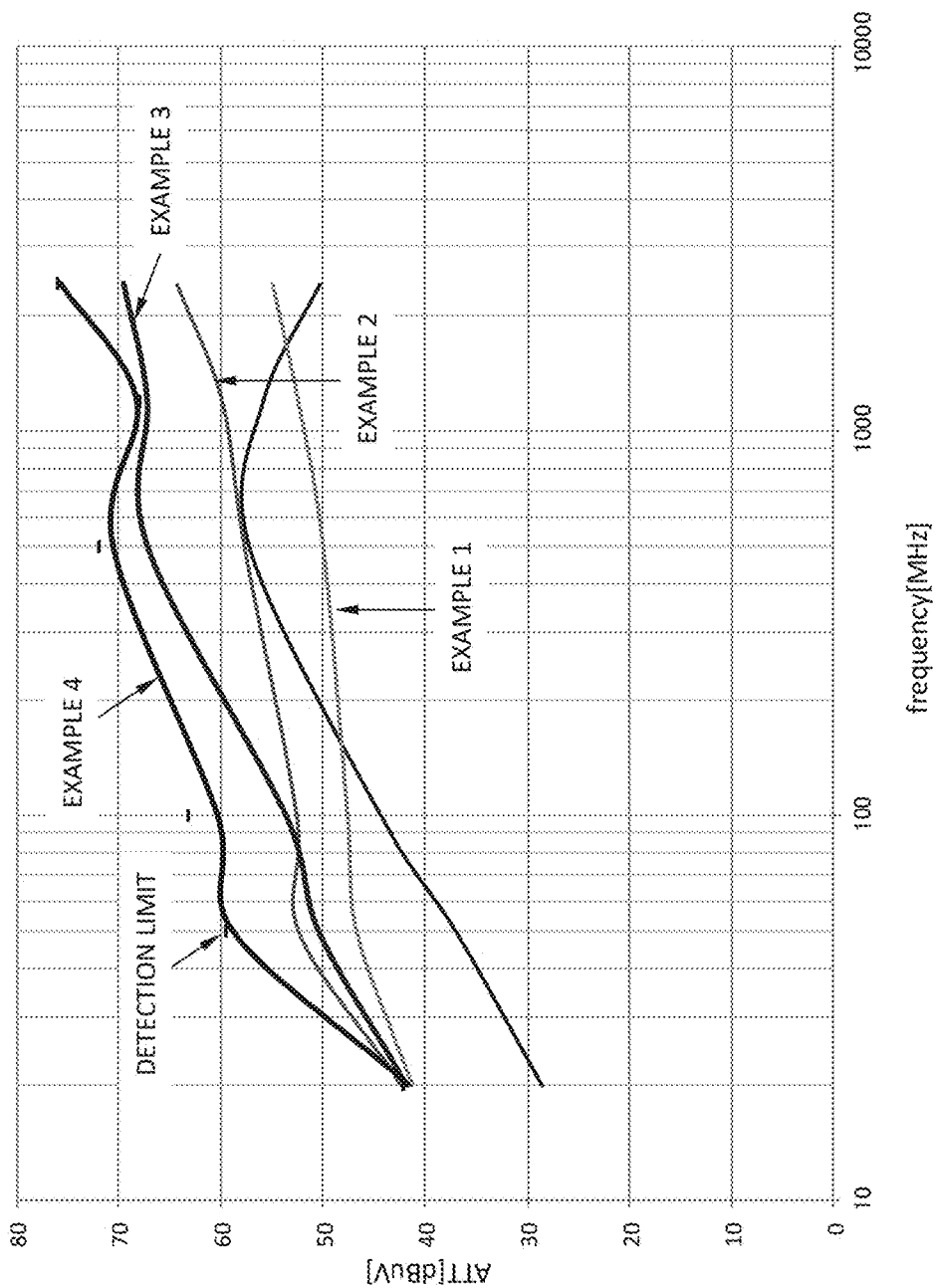
FIG. 22 is a graph indicating measurement results of examples.

As illustrated in FIG. 22, it is confirmed that the sample 1 exhibits a larger noise attenuation amount than the comparative sample in a band of 20 MHz to 150 MHz and in a band of 1.5 GHz to 2.4 GHz. The samples 2 to 4 exhibit a larger noise attenuation amount than the comparative sample over the entire measured band (20 MHz to 2.4 GHz). Particularly, in a band exceeding 80 MHz, the higher the occupying ratio of the power supply pattern G, the larger the noise attenuation amount becomes. Further, the samples 1 to 4 exhibit a noise attenuation amount close to the measurement limit at frequencies near 20 MHz. Further, the sample 3 exhibits a noise attenuation amount close to the measurement limit at frequencies near 1 GHz, and sample 4 exhibits a noise attenuation amount close to the measurement limit over the entire measured band.

What is claimed is:

1. An electronic circuit package comprising:
    a substrate having a power supply pattern;
    a plurality of electronic components mounted on a surface of the substrate; and
    a molding member that covers the surface of the substrate so as to embed the electronic components therein,
    wherein the molding member includes a first portion located above each of the electronic components and a second portion located between the electronic components, each of the first and second portions having conductivity;
    wherein the power supply pattern includes a first power supply pattern exposed to the surface of the substrate, and
    wherein the molding member contacts the first power supply pattern, thereby a predetermined potential is applied to each of the first and second portions of the molding member.

2. The electronic circuit package as claimed in claim 1, wherein an occupying ratio of the first power supply pattern in the surface of the substrate is equal to or higher than 2%.

3. The electronic circuit package as claimed in claim 2, wherein the occupying ratio of the first power supply pattern in the surface of the substrate is equal to or higher than 8%.

4. The electronic circuit package as claimed in claim 1, wherein the first power supply pattern is disposed at least one corner portion of the surface of the substrate.

5. The electronic circuit package as claimed in claim 4, wherein the first power supply pattern is disposed at least two corner portions of the surface of the substrate.

6. The electronic circuit package as claimed in claim 5, wherein the two corner portions are diagonally opposed to each other.

7. The electronic circuit package as claimed in claim 1, wherein the first power supply pattern is disposed along at least one side of the surface of the substrate.

8. The electronic circuit package as claimed in claim 7, wherein the first power supply pattern is disposed along at least two sides of the surface of the substrate.

9. The electronic circuit package as claimed in claim 8, wherein the two sides are opposed to each other.

10. The electronic circuit package as claimed in claim 1,
    wherein the power supply pattern includes a second power supply pattern exposed to a side surface of the substrate, and
    wherein the molding member further contacts the second power supply pattern.

11. The electronic circuit package as claimed in claim 10,
    wherein the side surface of the substrate includes a side surface upper part and a side surface lower part protruding from the side surface upper part,
    wherein the second power supply pattern is exposed to the side surface upper part of the substrate, and
    wherein the molding member covers the side surface upper part of the substrate without covering the side surface lower part of the substrate.

12. The electronic circuit package as claimed in claim 1, further comprising a metal film that covers the molding member and has higher conductivity than that of the molding member.

13. The electronic circuit package as claimed in claim 1,
    wherein the molding member includes a resin material and a first filler blended in the resin material, and
    wherein a surface of the first filler is covered with a metal coating having higher conductivity than that of the first filler.

14. The electronic circuit package as claimed in claim 13, wherein the first filler comprises a magnetic material.

15. The electronic circuit package as claimed in claim 14, further comprising a magnetic film that covers the molding member and has higher permeability than that of the molding member.

16. The electronic circuit package as claimed in claim 13, wherein the molding member further includes a second filler having a size smaller than that of the first filler, and
wherein a surface of the second filler is covered with a metal coating.

17. The electronic circuit package as claimed in claim 16, wherein the second filer comprises a magnetic material.

18. The electronic circuit package as claimed in claim 16, wherein the second filer comprises a conductive material.

19. The electronic circuit package as claimed in claim 16, wherein the second filer comprises an insulating material.

20. The electronic circuit package as claimed in claim 14, wherein the first filler comprises a material containing 32 wt. % to 39 wt. % of a metal material composed mainly of Ni in Fe.

21. The electronic circuit package as claimed in claim 1, further comprising an insulating coating that insulates the electronic components and their terminal electrodes from the molding member.

22. The electronic circuit package as claimed in claim 1, wherein a volume resistivity of the molding member is equal to or less than $1 \times 10^{-4}$ Ω·cm.

23. An electronic circuit package comprising:
a substrate having a main surface;
a first land pattern formed on the main surface of the substrate;
a power supply pattern formed on the substrate;
an electronic component mounted on the main surface of the substrate; and
a molding member covering the main surface of the substrate so as to embed the electronic component therein,
wherein the molding member includes a resin material and a plurality of fillers blended in the resin material, each surface of the plurality of fillers being covered with a metal material, and
wherein the molding member contacts the first land pattern and the power supply pattern to thereby apply a predetermined potential to each of the first land pattern and the power supply pattern.

24. The electronic circuit package as claimed in claim 23, further comprising:
a second land pattern formed on the main surface of the substrate, wherein the electronic component has a terminal electrode connected to the second land pattern; and
an insulating coating formed on the second land pattern and the terminal electrode so as to prevent the molding member from contacting the second land pattern and the terminal electrode.

25. The electronic circuit package as claimed in claim 24, wherein the insulating coating is small in thickness than the molding member.

26. The electronic circuit package as claimed in claim 24, wherein the electronic component further comprises another terminal electrode connected to the first land pattern, and
wherein the insulating coating partially covers the first land pattern so as not to prevent the molding member from contacting the first land pattern.

27. The electronic circuit package as claimed in claim 26, wherein the insulating coating covers the another terminal electrode of the electronic component so as to prevent the molding member from contacting the another terminal electrode.

28. The electronic circuit package as claimed in claim 23, wherein each of the fillers is smaller in size than the electronic component.

29. The electronic circuit package as claimed in claim 23, wherein the electronic component is directly in contact with the metal material included in the molding member.

* * * * *